Aug. 28, 1956 L. PLAMBECK, JR 2,760,863

PHOTOGRAPHIC PREPARATION OF RELIEF IMAGES

Filed Dec. 19, 1952

INVENTOR
LOUIS PLAMBECK, JR.

BY Lynn Barratt Morris
ATTORNEY 2,760,863

Patented Aug. 28, 1956

2,760,863

PHOTOGRAPHIC PREPARATION OF RELIEF IMAGES

Louis Plambeck, Jr., Wilmington, Del., assignor to E. I. du Pont de Nemours and Company, Wilmington, Del., a corporation of Delaware Application December 19, 1952, Serial No. 326,841

23 Claims. (Cl. 95—5.6)

This invention relates to a process for preparing relief images suitable for direct use as printing plates and more particularly to a process for preparing such relief images employing a photopolymerization step. The invention further relates to photopolymerizable elements and printing plates.

Printing is an old and well established art but the making of printing plates, particularly for high quality, precise detailed work, today still requires the slow hand work of technicians. Much effort has been devoted during the last 50 to 100 years in attempts to prepare printing plates with less tedious hand work. A large amount of art, including patents, journal articles and textbooks, attests to the extensive efforts of these attempts and the essenial failure of prior investigators to solve the problem satisfactorily.

One of the most widely used procedures for preparing printing plates is the photoengraving process wherein by exposing metals coated with very thin layers of photosensitive compositions to light through an image-bearing transparency a reverse image is formed in the photosensitive layer of the image borne in the transparency. The unexposed areas of this thin photosensitive layer are then removed by selective washing, leaving a relief of the desired image on the metal sub-base which is so thin that it cannot be used directly for printing and serves only as an acid resist. After selective etching of the metal surface in the unexposed, i. e., now unprotected, areas to suitable depths the plate is then capable of printing use.

In order to combat undercutting of the image surface, the etching is carried out in a series of "bites," i. e., in repetitive etching exposures, and between "bites" the plate is treated to protect the sides of the relief formed in the preceding "bite." Not only is this procedure time consuming but it is extremely difficult to obtain an image with smooth, sloping shoulders. Instead, the general effect of the successive bites is to form stepped shoulders which often have rough or jagged portions. It is axiomatic that a printing plate is only as deep as the first step in the shoulder. During use, ink accumulates on the shoulders and in time the press must be stopped and the plate cleaned to avoid blurred impressions. In addition, the rough or jagged shoulder areas may damage the ink rollers.

Photoengraved plates generally require extensive hand tooling or re-etching operations to get the proper distinction between printing and non-printing areas. These resulting plates could be used directly in the printing process but they generally do not exhibit a sufficiently long presslife to be satisfactory in most commercial printing. Because of the control problems involved in photoengraving, it is difficult to make exact duplicates by repeating the plate-making process and recourse must be made to duplicating methods such as stereotyping or electrotyping. Because of difficulties inherent in electrotyping procedures, the duplicate printing plates prepared thereby are generally variable in relief height and accordingly even more skilled hand work is necessary to correct the duplicate plates so that they have constant printing height in any one plate, furthermore, detail is irretrievably lost.

More recently in order to avoid the use of heavy metal printing plates which necessitate heavy and costly printing machinery, light plastic printing plates have been prepared by making a negative relief from a photoengraved plate in a thermosetting resin, and preparing from the said negative relief a duplicate of the initial photoengraved plate from a thermoplastic synthetic resin. The duplicate thermoplastic plate is then used as the actual printing plate. Such a procedure admittedly solves some of the weight problem and permits decreases in the size and cost of the printing press but produces a printing plate no better than the initial photoengraved metal plate.

It has been proposed to prepare relief-forms for printing (see British Patent 566,795) by exposing a layer of a liquid, polymerizable ethenoid composition to heat and/or light rays passed through a transparency bearing the image which it is desired to reproduce so that the ethenoid composition polymerizes to form a rigid sheet (i. e., polymerization is carried out necessarily, although in different degrees, in both the exposed and unexposed areas) which is then subjected to heat or solvent treatments to reveal the latent relief image. There are a number of theoretical and practical disadvantages to these procedures. The specific exposure times given are long, e. g., four hours. Development of the latent image by a stoving or baking operation so that the relief is obtained by shrinkage requires that the polymerizable layer be quite thick. Development by solvent treatment of the rigid polymer material is time-consuming and requires extremely careful handling of the soft, swollen relief which then must be dried under carefully controlled conditions to avoid distortion of the polymer gel as it loses solvent.

Furthermore, it is obvious that the underpolymerized areas obtained in accordance with the methods described in British Patent 566,795 are on the bottom surface of the rigid polymerized layer because photopolymerization starts at the surface nearest the light source. Hence, the stoving method and the shrinking method involve shrinkage and collapse of the layer in order to bring out the relief image which is non-uniform in height.

It has now been found that letterpress printing plates which have uniform printing height can be prepared by exposing with actinic light through a process transparency, e. g., a process negative or positive (a image-bearing transparenry consisting solely of substantially opaque and substantially transparent areas where the opaque areas are substantially of the same optical density, the so-called line or halftone negative or positive) a photopolymerizable layer or stratum comprising a polymerizable ethylenically unsaturated composition (e. g., a compound or mixture of compounds) having intimately dispersed therethrough an addition polymerization initiator activatable by actinic light, said layer or stratum being superposed on a suitable adherent support, i. e., adherent to the photopolymerized composition, until substantially complete polymerization takes place in the exposed areas and substantially no polymerization takes place in the non-exposed areas, and essentially completely removing the layer, e. g., the unpolymerized composition together with any admixed material, in said non-exposed areas. The photopolymerizable layer need not be composed of monomers only but can also contain some polymer, including incompletely polymerized compounds, but substantially no further polymer forms in the unexposed areas during exposure.

The polymerizable ethylenically unsaturated composition layer being transparent to actinic light is photopolymerized clear through to the support, whereas, the areas not exposed remain in substantially their original state, that is, no significant polymerization takes place in the areas protected by the opaque images in the process transparency. If liquid monomers are used initially the unpolymerized portion can be removed by draining, brushing, blotting or it can be washed away with a suitable liquid or solvent therefor. Solid or gel strata require more vigorous treatment, e. g., extensive washing with solvent and/or mechanical action.

The photopolymerizable layer can vary from a liquid to a solid state, including a gel state. Its thickness is a direct function of the thickness desired in the relief image and this will depend on the subject being reproduced and particularly on the extent of the nonprinting areas. In the case of photopolymerized halftones, the screen used also is a factor. In general, the thickness of the layer to be photopolymerized on these base plates will vary from 3 to 250 mils. Layers ranging from 3 to 30 mils in thickness and usually from 3 to 7 mils will be used for halftone plates. Layers ranging from 10 to about 60 mils in thickness will be used for the majority of letterpress printing plates, and it is with these thicknesses that the process of this invention is particularly effective. Layers thicker than 50–60 mils will be used for the printing of designs and relatively large areas in letterpress printing plates.

Actinic light from any source and of any type can be used in carrying out the process of this invention. The light may emanate from point sources or be in the form of parallel rays or divergent beams. In order to reduce the exposure time, however, it is preferred to use a broad light source, i. e., one of large area as contrasted to a point source of light, close to the image-bearing transparency from which the relief image is to be made. During exposure it is important that the image-bearing transparency be maintained in as flat a condition as possible in contact with the photopolymerizable layer since the degree of perfection of intimate interface, usually planar, contact between the two elements determines the uniformity of height of the relief. Accordingly, it is desirable to use such standard photographic devices as vacuum or simple glass plate pressure printing frames.

In order to facilitate separation of the transparency from the selectively photopolymerized layer at the end of the exposure some form of a parting layer can be introduced between the transparency and the photopolymerizable layer. This layer can take the form of a thin, nonadherent, transparent film, foil or membrane, e. g., regenerated cellulose, a cellulose ester including cellulose acetate, cellulose propionate; a superpolymer including polyvinyl alcohol, polyethylene terephthalate, etc., or can be a thin petrolatum or silicone film spread upon the surface of the image-bearing transparency. After exposure the transparency can be removed from contact with the polymerized layer or parting layer and used similarly to produce an image in another photopolymerizable stratum.

By using a broad light source, relatively close to the image-bearing transparency, the light rays passing through the clear areas of the transparency will enter as divergent beams into the photopolymerizable layer, and will thus irradiate a continually diverging area in the photopolymerizable layer underneath the clear portion of the transparency, resulting in the formation of a polymeric relief which is at its greatest width at the bottom surface of the photopolymerized layer, the top surface of the relief being the dimensions of the clear area. These reliefs are in the form of conical and pyramidal frustums, the sides and/or projections of the sides of which preferably make essentially equal angles with the plane of the base, said angles being determined by the geometry of the light source. The cross-section of such a relief image, obtained from a plane passing through the surface of the relief and meeting the base or a plane parallel to the base at right angles, will be a trapezoid. Such relief images are advantageous in printing plates because of their greater strength and the smooth continuous slope of their sides as contrasted to the undercut or jagged, irregular nature of the sides of photoengraved reliefs. This is of importance since the smooth sloping reliefs obtained in this process reduce or eliminate the problem of ink-buildup mentioned previously that is always encountered with photoengraved plates.

Such tapered reliefs can also be obtained by the use of oblique light beams from sources arranged around the periphery of the area to be exposed. In such instances the support with its photopolymerizable layer can be rotated during exposure so as to equalize the cumulative distribution of light during exposure on all portions of the negative.

The degree of taper of the relief image below its printing surface can be controlled in accordance with this invention, within limits, by the geometry of the light source and can be calculated optically. Thus, the taper can be controlled so that the sides of each image will make an angle of from about 50° to 90° with the horizontal of the base. This angle is the base angle of the above-described trapezoidal, planar, base-cutting cross-section of the pyramidal and conical frustrum shaped printing relief obtained in this process. The minimum angle for both line and halftone reliefs, i. e., the maximum broadening, is determined by the refractive indices of the image-bearing transparency support and of the photopolymerizable layer, and is related to the critical angle at which total reflection takes place in the system. For the majority of useful supports and polymerizable materials, the minimum angle between the image side and the base is in the range 44° to 54°. This is the theoretical limit and is unattainable in practice since it would require that the incident ray be in the plane of the negative.

For line printing plates the depth of a non-printing area of small extent preferably is at least equivalent to the distance between adjoining printing areas. For this condition it has been found that the limiting ray defining the edge of the image must intersect the plane of the base at an angle of 63.4°, i. e., the angle whose tangent is 2. With a photopolymerizable composition as in Example VIII (below) and a negative transparency pressed against the bottom surface of a glass plate, both having refractive indices of approximately 1.52, the bundle of rays incident on the negative should intersect the negative plane at no less than about 47°. It has been found that for the most useful line plates in which image heights of 30 to 60 mils are sought, the preferred angle between the side of the image and the base lies between 63.4° and 76°, i. e., angles with tangents of 2–4.

For halftone plates in which 3–7 mil thick sensitive layers are adequate, the lower preferred limit drops to 55° and the upper limit extends to 90°. In this case the additional strength furnished by the sloping shoulders is not essential since the height of the smallest element desired is very close to its diameter.

With light sources consisting of lamps in individual reflectors, the beams can easily be adjusted to give the required angle. With a broad uniform light source, such as a bank of fluorescent tubular lamps, the extremely low angle rays come from more remote portions of the source, hence are lower in intensity and do not ordinarily effect polymerization. However, when extremely fine lines are being reproduced and extended exposures are used, coarser detail may tend to broaden excessively. In this case a light-controlling baffle (e. g., an egg-crate baffle) between the light source and the negative can be used to eliminate those rays below the minimum desired angle.

The base material used can be any natural or synthetic product, capable of existence in film or sheet form and can be flexible or rigid, reflective or non-reflective of actinic light. Because of their generally greater strength in thinner form, e. g., foils, and readier adaptability for use in printing presses, it is preferable to use metals as the base materials. However, where weight is critical, the synthetic resins or superpolymers, particularly the thermoplastic ones, are preferable base materials. In those instances where rotary press plates are desired both types of base or support materials can be used to form flat relief plates which are then formed to the desired shape. The thermoplastic resins or high polymers are particularly suitable base materials in such uses. Such rotary press plates can also be prepared by using cylindrically shaped base plates of the various types carrying the photopolymerizable compositions and exposing them directly through a concentrically disposed image-bearing transparency in like manner.

Suitable base or support materials include metals, e. g., steel and aluminum plates, sheets and foils, and films or plates composed of various film-forming synthetic resins or high polymers, such as the addition polymers, including those mentioned later, in both monomeric and polymeric form for use in the photopolymerizable layer and in particular the vinylidene polymers, e. g., the vinyl chloride polymers, vinylidene chloride copolymers with vinyl chloride, vinyl acetate, styrene, isobutylene and acrylonitrile; and vinylchloride copolymers with the latter polymerizable monomers; the linear condensation polymers such as the polyesters, e. g., polyethylene terephthalate; the polyamides, e. g., polyhexamethylene sebacamide; polyester amides, e. g., polyhexamethylene-adipamide/adipate; etc. Fillers or reinforcing agents can be present in the synthetic resin or polymer bases such as the various fibers (synthetic, modified, or natural), e. g., cellulosic fibers, for instance, cotton, cellulose acetate, viscose rayon, paper; glass wool; nylon, and the like. These reinforced bases may be used in laminated form.

When highly reflective bases and particularly metal base plates are used any oblique rays passing through clear areas in the image-bearing transparency will strike the surface of the base at an angle other than 90° and after resultant reflection will cause polymerization in non-image areas. The degree of unsharpness in the relief progressively increases as the thickness of the desired relief and the duration of the exposure increases. It has been found that this disadvantage can be overcome in carrying out the invention when the photopolymerizable composition is deposited on a light-reflective base by having an intervening stratum sufficiently absorptive of actinic light so that less than 35% of the incident light is reflected. This light-absorptive stratum must be adherent to both the photopolymerized image and the base material. The light-absorptive layer can be formed directly on the surface of the light reflective base, for instance, by dyeing in the case of anodized aluminum plates, by "blueing" or chemical blackening such as is obtained with molten dichromate baths in the case of iron or steel plates. In these instances a separate resin anchor layer adherent to the colored base and the photopolymerizable layer is applied. A practical method of supplying the layer absorptive of reflected light or non-halation layer is to disperse a finely-divided dye or pigment which substantially absorbs actinic light in a solution or aqueuos dispersion of a resin or polymer which is adherent to both the support and the photopolymerized image and coating it on the support to form an anchor layer which is dried.

When the support material is not sufficiently adherent to the photopolymerized layer a separate anchor layer may be used. It may be made of a compatible resin or film-forming polymer which is strongly adherent to both the support and the photopolymerized layer. In some cases two or more different anchor layers can be used so that the photopolymerized layer is strongly adherent to the coated support.

The resin or polymer anchor layer can be composed of any synthetic resin or polymer which is capable of forming a smooth hard resinous film and had good adherence to the base and superposed layer. A large number of suitable materials are available. In general, the resins or polymers which have been used as carriers in the manufacture of paints, varnishes and lacquers are satisfactory. Practical resins or polymers are those which can be insolubilized or set up by controlled cross-linking with the aid of heat alone or in the presence of a catalyst or by a catalyst alone. The resins or polymers from the monomers described later for use in the photopolymerizable layers can be used in the anchor layer and have the advantage of being strongly adherent to the photopolymerized image. Other suitable polymers include the hydrophobic polyvinyl acetals. The polymers, as is obvious from the above, should be unreactive with the light-absorptive materials and adherent to the base or support and to the photopolymerizable layer before and after polymerization.

Inasmuch as the photopolymerization initiators or catalysts generally exhibit their maximum sensitivity in the ultraviolet (UV) range, the light source should furnish an effective amount of this radiation. Such sources include carbon arcs, mercury vapor arcs, fluorescent lamps with special ultra-violet light emitting phosphors, argon glow lamps, and photographic flood lamps. Of these, the mercury vapor arcs, particularly the sun-lamp type, and the fluorescent lamps with special phosphors, such as the fluorescent sun-lamps, are most suitable. Groups of these lamps can be easily arranged to furnish the broad light source required to give a frustum-shaped relief image of good mechanical strength. The sun-lamp mercury vapor arcs are customarily used at a distance of 7 to 10 inches from the photopolymerizable layer. On the other hand, with a more uniform extended source of low intrinsic brilliance, such as a group of contiguous fluorescent lamps with special phosphors, the plate can be exposed within an inch of the lamps.

The photopolymerizable layer can be composed of any addition-polymerizable monomer (viz., ethylenically unsaturated monomer) and any photopolymerization initiator or catalyst, both either singly or in admixture with one or more other similar monomers and initiators. The photopolymerizable layer can also contain added preformed compatible condensation or addition polymers generally of the latter class, and most conveniently of the same general type as the polymerizable monomer or monomers being used, as well as immsicible polymeric or non-polymeric organic or inorganic fillers or reinforcing agents, which are essentially transparent, e. g., the organophilic silicas, bentonites, silica, powdered glass, etc., having a particle size less than 0.4 mil and in amounts varying with the desired properties of the photopolymerizable layer, which can be liquid or solid, including gel, in nature. The preferred monomers are the ethylenically-unsaturated, addition-polymerizable monomers, particularly those wherein the said ethylenic linkages are terminal, i. e., those monomers having the characteristic $CH_2=C<$ group, i. e., the vinylidene monomers. Because of the greater speed with which such compositions polymerize to rigid materials, it is preferred that the photopolymerizable layer contain appreciable proportions of ethylenically-unsaturated polymerizable materials containing a plurality of said polymerizable linkages per molecule. These types of monomers are conventionally referred to as cross-linking agents. This cross-linking facility can be incorporated in the photopolymerizable layer through the use of polymers containing the indicated plurality of polymerizable unsaturated linkages in which instance such materials serve a dual function of both increasing the viscosity of the photopolymerizable layer to the desired level and making available the desired cross-linking facility for the photopolymerization.

In a convenient mode of carrying out the process of this invention, the image-bearing process transparency, i. e., a process line or halftone negative is placed in operative association with the surface of a liquid layer of the photopolymerizable composition which has just been cast directly on the sheet support, or on a polymer or resin anchor layer, which may be absorptive of actinic light, on the support, preferably a metal base plate. The liquid layer is exposed through the transparency to a source of actinic light until the monomerinitiator layer is polymerized to the insoluble stage in the exposed areas. The thickness of the ultimate relief in such a process can be controlled by varying the thickness of the photopolymerizable layer. This can be done by inserting gaskets or spacers of the desired thickness between the image-bearing transparency or transparent plate on which it is mounted and the sheet support, e. g., a metal base plate bearing a light-absorbing surface coating. Elements having a solid, including gel, photopolymerizable layer can be exposed in like manner.

The photopolymerizable composition should be of such viscosity as to flow only slowly when confined between the surfaces of the base and the image-bearing transparency and/or transparent cover. Suitable viscosities may range from 0.25 to 150 and preferably from 5 to 15 poises. A convenient method of preparing the latter in the desired viscosity range is to incorporate into the liquid photopolymerizable mixture from 5 to 25% of a preformed polymer, preferably one obtained by the polymerization of a terminally monoethylenically unsaturated polymerizable monomer. Such preformed polymers must give essentially transparent mixes with the polymerizable monomers and initiators and can be soluble therein or swollen hereby or can be insoluble therein and non-swellable thereby. In the latter case, they should be of relatively fine particle size, e. g., ⅕ to $\frac{1}{10}$ of the finest detail to be reproduced, viz., particles no greater than 0.2 to 0.4 mil in maximum dimension. Usually the preformed polymer so added will be from the monomer being used or of the same general class. In order to increase the degree of insolubility of the areas polymerized in the layer by this process, i. e., the relief, it is desirable to incorporate from 5 to 90% of cross-linking material in the starting photopolymerizable composition, e. g., the polymerizable monomers containing two ethylenic unsaturations, conjugated or not. It is to be noted that if desired the photopolymerizable layer can be entirely composed of such monomers along with small amounts of the photopolymerization initiators or catalysts.

This invention and suitable apparatus for practicing it and novel photopolymerizable elements thereof are illustrated in the accompanying drawing which forms a part of this specification. In the drawing which illustrates practical embodiments of the invention, Fig. 1 is an enlarged sectional schematic view of an apparatus and cell containing a photopolymerizable liquid on a metal plate;

Figure 2:
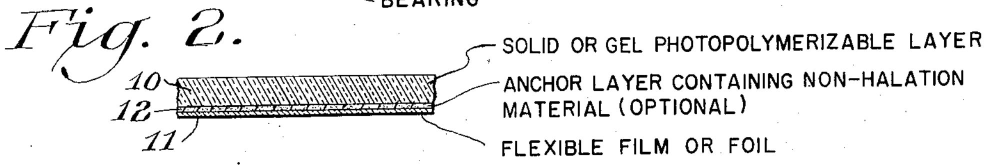
Fig. 2 is a sectional view of a photopolymerizable element with a solid photopolymerizable layer on a flexible film or foil.
Figure 3:
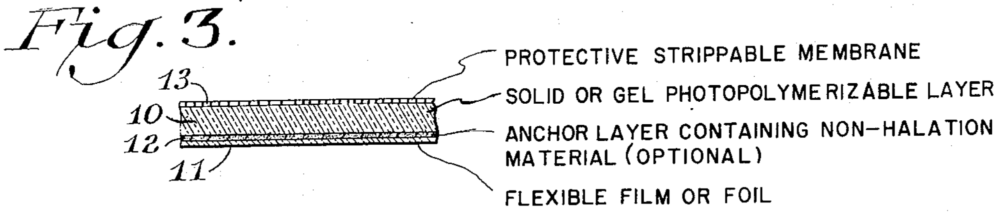
Fig. 3 is a sectional view of a photopolymerizable sheet element, suitable for mounting on a metal plate.

Referring now to Fig. 2 of the drawing which illustrates one novel photosensitive element of this invention, it comprises a solid photopolymerizable layer 10, which can be a gel, superposed on a sheet support or base preferably a flexible thin film or foil 11, including both reflective and non-reflective flexible bases which in the case of the former will also have interposed between the photopolymerizable layer and the support an anti-halation layer 12. Such elements can be made by the use of relatively large amounts of preformed soluble polymer or added inert inorganic fillers, or insoluble polymers, the latter both being of a particle size no greater than 0.2 to 0.4 mil in its greatest dimension which are essentially transparent in the medium e. g., powdered glass, silica flour, and the like, and are preferably organic modified and essentially transparent in the medium, e. g., the organophilic bentonites, silicas, and the like, which particles, in general, have their greatest dimension of the order of 5 microns and usually one micron and less, or by the partial prepolymerization of the photopolymerizable composition to the desired degree either by photo or thermal means, particularly when an appreciable proportion of a cross-linking material is present. A still further improved element with a solid or gel photopolymerizable layer is shown in Fig. 3 and has a thin strippable protective layer 13 superposed on the said photopolymerizable layer 10. This prevents the surface from being marred or scratched and when tacky in nature from holding or adsorbing dust particles.

The strippable layers can be transparent or opaque and in the case of the former are conveniently left on the photopolymerizable layer during exposure and serve thereby also as a parting layer between the image-bearing transparency and the photopolymerizable layer. In the latter case, i. e., with an opaque strippable protective layer, the layer should be removed prior to exposure.

The protective layer, however, need not necessarily be a separate strippable film or membrane. For instance, it has been found, surprisingly, that a light dusting of the top of the solid or gel photopolymerizable layer with talc or similar other unreactive materials satisfactorily eliminates problems arising from the tacky, etc., nature of the upper surface of said polymerizable layer.

Figure 4:
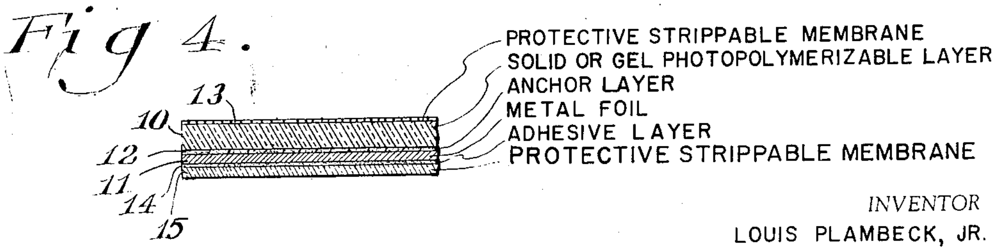
Fig. 4 is a sectional view of a modified photopolymerizable sheet element, suitable for mounting on a metal plate.

The photosensitive element shown in Fig. 4 of the drawing consists of a thin metal foil support 11, an anchor layer 12 containing an antihalation material, a solid photopolymerizable sheet 10, which has on its upper surface a protective membrane 13. The reverse surface of the metal foil bears a pressure-sensitive adhesive layer 14 which carries a strippable protective layer 15. The latter layer is removed prior to mounting or superposing the photopolymerizable element on the ultimate base, e. g., metal or other plate or a printing block prior to exposure. Similarly the photopolymerizable element shown in Figs. 2 and 3 where the solid or gel photopolymerizable layer has no rigid support and is superposed on a flexible but self-supporting semi-rigid material, such as a thin plastic film or a metal foil, preferably the element is mounted or superposed on a permanent working base, i. e., the material which ultimately forms the real base for use in actual printing, prior to exposure of the photopolymerizable layer and processing to form a relief image. Under such conditions very little chance exists for any plastic deformation or change of the relative order of the individual line or halftone images of the final relief, due to physical handling.

Suitable materials for use as the light absorptive material used with a base material reflective of actinic light, such that the degree of light reflectance is less than the previously mentioned 35%, are the dyes and pigments. The latter are preferred because they do not bleed into the photopolymerizable layer. These materials must be unreactive with both the polymer or resin used for the anchor layer and the photopolymerizable layer. As pointed out previously these light absorptive materials are preferably applied to the base surface in suspension in the polymer or resin used for the anchor layer.

In the following examples, which illustrate but are not intended to limit the process of this invention, and wherein the parts given are by weight, the reflectance values given are determined with a Pfaltz and Bauer (P & B) Universal Reflectometer Model M–2. For comparison purposes in these determinations, the instrument is first adjusted to indicate 0% reflectance with the standard black glass plate and 100% reflectance with the standard white glass plate. (The particular standard plates, when tested against a magnesium oxide standard in a General Electric Recording Spectrophotometer, exhibited reflectances of 2% and 78%, respectively). Under these conditions, representative untreated metal base plate controls exhibited P & B reflectances of 70–92%.

*Example I*

A coating composition was prepared by grinding 9 parts polyvinyl n-butyral, 8.6 parts lead chromate, 1.4 parts Asbestine, 53 parts isopropanol, and 13 parts methyl isobutyl ketone. Just prior to use, this composition was thinned to the desired viscosity with from 15 to 25 parts of a mixture of 4.3 parts phosphoric acid (85%), 4.3 parts water, and 16.4 parts isopropanol. The thinned mix was brushed onto clean aluminum plates and allowed to air-dry at least 24 hours. During this time the action of the acid on the butyral causes formation of cross-links and insolubilization of the layer. Depending on the viscosity of the mix and the amount of brushing used, the primer coat varied from a semi-opaque grayish-yellow to nearly transparent.

Figure 1:
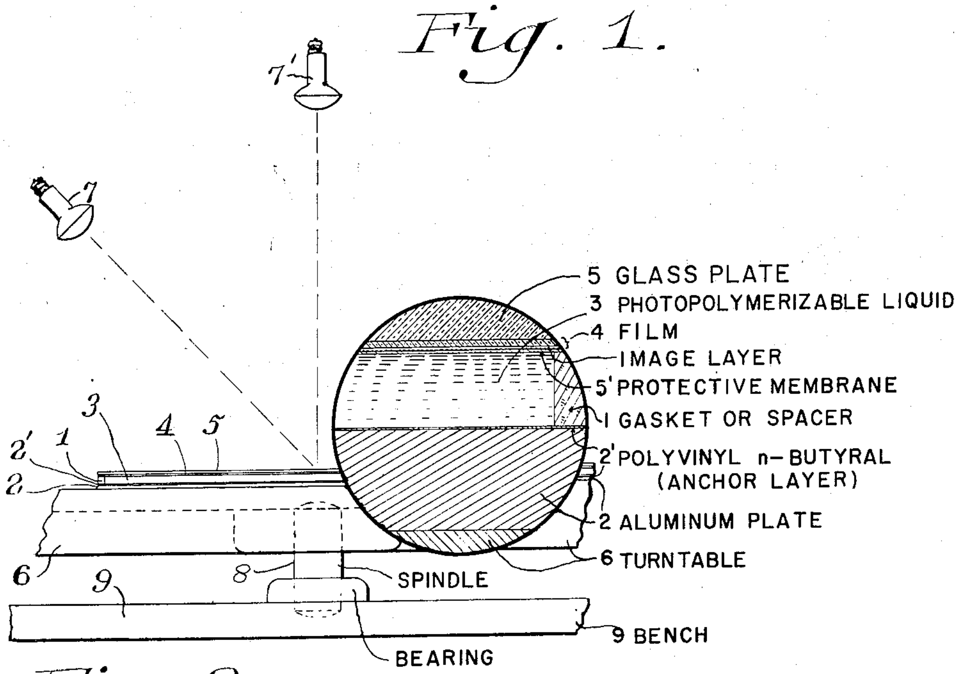

A photopolymerizable viscous liquid was prepared by combining 55 parts methyl methacrylate monomer, 25 parts polymethyl methacrylate, 20 parts of the monomeric polyethylene glycol dimethacrylate mixture described in Example I of Marks U. S. Patent 2,468,094, and 1 part benzoin. Spacers 1 as shown in Fig. 1 of the drawing approximately 30 mils thick were arranged at the edges of an aluminum plate 2 primed as above and carrying the polyvinyl n-butyral resin layer 2′. A layer 3 of the above photopolymerizable viscous liquid was poured on the polyvinyl-n-butyral resin layer of the primed plate which exhibited a P and B reflectance value of about 32%. A photographic line process negative was wetted with water and then squeegeed onto the bottom surface of a glass plate 5. A regenerated cellulose membrane 5′ was placed over the negative and the plate with the transparency and membrane was lowered onto the photopolymerizable liquid and pressed downwardly until it rested on the spacers. Excess liquid escaped at the edges. This cell was then placed on a horizontal turntable 6 underneath two transformerless mercury vapor sun lamps 7 and 7′. One lamp was 12 inches from the cell directly above, and the other lamp 8 inches away at a 45° angle to the vertical axis. The turntable was rotated at 4–5 revolutions per minute on spindle 8 which was journalled in the upper surface of bench 9. After an exposure of 10 minutes, the negative was stripped off and the unpolymerized liquid removed by washing the plate in an ethyl acetate/ethanol (85/15) mixture. A sharp relief image of the text on the negative was obtained. This image extended clear through the original layer of photoplymerizable composition. This plate was locked in the chase of a printing press and used for printing in the same way that conventional metal photoengraved plates are used.

When one of the aluminum plates carrying a very thin layer of the primer coat was used in a similar manner as a base plate for the preparation of a polymeric relief, the resulting image was unsharp because of extraneous polymer formed where light was reflected from the base. This plate gave poor copies when used on the printing press. The P & B reflectance value for the metal base plate coated with this thin primer layer averages about 63% reflectance.

*Example II*

A coating composition was prepared by dissolving 10 parts of a vinyl chloride/allyl glycidyl ether (80/20 parts by weight) copolymer (see U. S. 2,470,324) in 15 parts of a xylene/methyl isobutyl ketone (1/1) mixture. To this solution was added 0.07 part of citric acid monohydrate dissolved in a minimum amount of 2-methoxyethanol, 0.038 part of stannous chloride dihydrate dissolved in the minimum amount of 2-ethoxyethyl acetate, and enough of a saturated solution of a red oil dye of Colour Index No. 258 in xylene to impart a deep red color. The solution was brushed on clean aluminum plates, allowed to air dry, and then baked in an oven at 145–155° C. for one hour. Although the baked film was insoluble in methyl methacrylate monomer or acetone, the layer appeared to swell enough to allow the dye to be rapidly extracted by these solvents, leaving an essentially colorless layer. It was noted, however, that certain small areas which had been brushed over twice to cover up pin holes in the coating remained bright red after the acetone treatment. P & B reflectance values for these colored areas of the treated metal base plate averaged about 22% reflectance. Such an acetone-washed plate containing both clear and dyed areas was given an additional short bake to remove all the acetone and then used as a base plate for the preparation of a photopolymerized relief image. A layer of photopolymerizable monomer syrup of the type given in Example I approximately 18 mils thick was photopolymerized under a negative carrying a text in letters approximately equivalent in size to 8 point type in general after the manner described in Example I. After exposure and washing away the unpolymerized monomer, a relief image of the text was present on the base plate. Examination showed that the relief image formed over the undyed areas of the base plate was unsharp with recesses in the letters such as a, o, p, etc., nearly filled up, while where dye was present in the resin layer, the image was sharper and the recesses were much deeper, generally penetrating to the base itself.

*Example III*

A base plate was prepared by coating a 1/16 inch thick sheet of cellulose acetate film with a thin layer of a vinyl chloride/vinyl acetate/maleic acid (86/13/1) copolymer applied from a 20% solution in xylene/methyl isobutyl ketone (1/1). A photosensitive composition was prepared by mixing 240 parts of methyl methacrylate and 3 parts of benzoin and irradiating with ultraviolet light for 60–70 minutes to give a thin syrup to which was added 60 parts of monomeric polyethyleneglycol dimethacrylate. A 12 mil layer of this syrup on the prepared base was covered with a special test process negative containing a series of lines of widths from 2–65 mils as well as a group of 2-mil lines separated by 3-mil spaces and a group of 4-mil lines separated by 2-mil spaces. The emulsion surface of the negative was protected from contact with the photopolymerizable layer during the exposure by interposing between the negative and said layer a regenerated cellulose membrane. The assembly was placed on a horizontal turntable, after the manner shown in Fig. 1, above which was placed an RS type mercury vapor sun lamp which emitted a beam the center of which was approximately 3 inches off center of the turntable axis. The lamp was 7 inches above the plane of the turntable. With the turntable rotating at 4 R. P. M. the plate was given a 10-minute exposure after which the negative was removed and the unpolymerized material removed by scrubbing with a carbon tetrachloride/acetone (1/1) mixture. The cleaned plate was inked and printed. Even the 2-mil lines reproduced well and the groups of fine lines were actually shown in the print as separate lines. The image areas had tapered sides.

*Example IV*

By means of a rubber mill, two parts of carbon black were milled into 18 parts of a maleic acid-modified vinyl chloride/vinyl acetate copolymer (known to the trade as "Vinylite" VMCH and sold by Union Carbide and Carbon Corporation) containing usually about 1% maleic acid with the remainder being vinyl chloride and vinyl acetate in a weight ratio of 86:13. The resulting pigment/polymer blend was dispersed in a mixture of 40 parts xylene and 40 parts methyl isobutyl ketone. To this mixture was added 20 parts of the monomeric polyethylene glycol dimethylacrylate mixture described in Example I of Marks U. S. Patent 2,468,094, 0.4 part of 1,1′-azodicyclohexanecarbonitrile and 0.1 part of cobalt nitrate hexahydrate (as a 10% weight/volume solution in acetone). The black coating composition obtained in this manner was brushed onto clean aluminum plates, allowed to air dry, and then baked at 150° C. for 20 hours. This treatment caused polymerization of the dimethacrylate monomer mixture to give an insoluble network entrapping the linear vinyl chloride copolymer. The crosslinked layer was essentially insoluble in monomers, but the content of linear copolymer allowed the penetration and swelling necessary for good anchorage. Since the carbon-black pigment absorbed light effectively, the troublesome reflection from the metallic surface was entirely eliminated, and sharp, clear polymeric relief images were obtained by the photopolymerization procedure described in Example I above. The P & B reflectance values for the metal base plate treated with the black coating composition average 6–7% reflectance.

*Example V*

A standard, unpigmented wash primer was prepared by dissolving 109.5 parts of low molecular weight polyvinyl n-butyral in 622 parts of denatured ethanol, warming to 50° C., and adding to this solution a solution of 10.95 parts of 85% orthophosphoric acid in 98.6 parts of acetone to which had been added 4.65 parts of chromium trioxide dissolved in 9.3 parts of water. The mixture was held at 45–50° C. for 25 minutes, then cooled and 145 parts of butanol added. A pigmented concentrate was prepared by grinding in a pebble mill 228 parts of the above wash primer with 4.5 parts of Asbestine, 7.5 parts of carbon black, and 60 parts of n-butanol. Twenty parts by volume of the pigmented concentrate was diluted with 80 parts by volume of the unpigmented wash primer to give a coating composition which was applied to degreased steel panels by brushing. The P & B reflectance values were approximately the same as for the panels of Example IV.

A photopolymerizable composition was prepared by mixing 50 parts of monomeric polyethylene glycol dimethacrylate, 50 parts of acrylonitrile, and 1 part of benzoin. A layer of this composition 10 mils thick was flowed onto a primed plate prepared as above, covered with a line or process negative as described in Example I, and exposed to a mercury vapor lamp for 15 minutes at a distance of eight inches. After the exposure, the negative was removed and the unpolymerized composition removed by brushing with an 85/15 ethyl acetate/ethanol solvent mixture. This treatment left a sharp relief image on a clean metal base since the photopolymerizable composition softened the primer layer enough so that the mechanical action during removal of the unpolymerized monomer mixture caused the primer resin to flake off in the areas not protected by the image.

*Example VI*

A base plate was prepared by coating a steel panel with the black composition of Example V and photopolymerizing on this coating a 3-mil layer of the photopolymerizable composition of Example I. The polymer layer obtained in this way is especially adapted to anchor the image produced in a subsequent photopolymerization.

Forty parts of a 50% solution of vinyl polysiloxane in toluene was warmed to remove most of the toluene by evaporation leaving 23 parts of thick syrup. To this was added 55 parts of methyl methacrylate monomer, 25 parts of methyl methacrylate polymer, and 1 part benzoin. A layer 20 mils in thickness was coated on the above base plate and covered with a negative as described in Example I. After an exposure of 15 minutes to a mercury vapor lamp at a distance of eight inches, the negative was removed and the plate washed with an 85/15 ethyl acetate/ethanol solvent mixture. A sharp relief image was obtained.

*Example VII*

In order to demonstrate the utility of the nonreflecting base plate in aiding the formation of sharp images from photopolymerizable compositions containing a variety of photoinitiators, a series of experiments was carried out using aluminum base plates coated with the black composition described in Example IV. The photopolymerizable composition contained 68.8 parts of methyl methacrylate monomer, 31.2 parts of methyl methacrylate polymer, 20 parts of monomeric polyethylene glycol dimethacrylate, and 1 part of photoinitiator (see table below. A 15- to 20-mil layer of the photopolymerizable syrup between a process negative and the base plate was given a stepped exposure to a mercury vapor lamp at a distance of 8 inches in general after the manner described in Example I. The exposed plate was washed in an 85/15 by weight ethyl acetate/ethanol solvent mixture and the optimum exposure step noted as indicated in the table below. At the optimum exposure all the initiators gave equally sharp relief images. The images had tapered sides.

| Initiators: | Optimum exposure (min.) |
|---|---|
| Benzoin | 14 |
| Alpha-methylbenzoin | 15 |
| Benzoin methyl ether | 7 |
| Alpha-allylbenzoin [1] | 11 |
| Diacetyl | 20 |
| 1,1′-azodicyclohexanecarbonitrile | 21 |

[1] The preparation of this compound is described in Crandall application Ser. No. 316,565, filed October 23, 1952.

The aforesaid layer of photopolymerizable syrup, in the form of a 3-mil layer containing 1,1′-azodicyclohexanecarbonitrile as the initiator, has an optical density to the available actinic light of about 0.01 to a maximum of 0.06 and in the form of a 250-mil layer has a maximum optical density of 5.0.

*Example VIII*

An ⅛″ aluminum base treated with the black primer of Example IV was coated with a 3-mil clear anchor layer of the following composition: 230 parts of methyl methacrylate, 125 parts of isobutyl methacrylate, 120 parts of polymeric methyl methacrylate, 25 parts of monomeric polyethyleneglycol dimethacrylate, 5 parts of benzoin and 0.5 part of 1,1′-azodicyclohexanecarbonitrile, and the layer then photopolymerized, all as described in Example VI. A 100 line screen halftone negative on film was squeegeed to a glass plate, emulsion side up, using a thin film of white mineral oil as an adhesive. The emulsion surface of the film was then coated with a thin layer of a mold-releasing agent, e. g., "Vejin." Spacers 3 mils thick were placed at the edges of the base plate on which was flowed a thin layer of a photopolymerizable syrup of the following composition: 1 part of benzoin methyl ether, 30 parts of styrene, and 70 parts of a commercial, addition polymerizable unsaturated polyester prepared as described in general in Ind. & Eng. Chem. 42, 114–119 (1950) and 44, 11a (1952). The negative, as prepared above, was lowered onto the syrup which was allowed to flow out until the plate rested on the spacers. The assembly was then placed on a horizontal turntable over which were arranged an S–4 mercury vapor sunlamp 8″ above the plane of the table and two RS type mercury vapor lamps on opposite sides and 8″ above the table with their beam axes directed at the table at a 45° angle. The layer of photopolymerizable syrup has a maximum optical density of about 1.5 to the available actinic light. With the turntable rotating at 4 R. P. M., an exposure of 10 minutes was given. The negative was removed and the unpolymerized material washed away by immersing the plate in a tray of ethyl acetate/ethanol (87/13 by weight) and gently brushing the plate with a camel hair brush. When all unpolymerized material had been diluted and washed away, the plate was removed, rinsed and blotted with a paper tissue. Examination under a microscope showed that an excellent relief image had been obtained. The holes in the shadow areas were of sufficient depth, so that these areas printed properly and the highlight dots were about 4 mils in height with regularly sloping sides making angles of about 58° with a plane parallel to the base. The plate was trimmed, mounted and printed in the normal manner and was found to give excellent printed copies.

*Example IX*

The surface of a cored magnesium plate ("Unibase") 850 mils thick was cleaned with steel wool and coated with the unpigmented wash primer of Example V, to which had been added 2% of the di-o-tolylguanidine salt of the dye of Colour Index No. 640. After the primer coating was dry, a 25-mil layer of the anchor mixture of Example VIII was applied and photopolymerized under glass to give a smooth uniform layer of polymer. This was sanded lightly to provide a slight tooth. Metal spacers approximately 57 mils thick were arranged on the magnesium surface at the corners of the base from which the anchor layer had been removed. A layer of the photopolymerizable composition of Example VIII was applied to the plate. Upon this layer and in direct contact with it was placed a 9 by 12 inch stripping film process negative mounted on plate glass. The image was that of a ruled form containing lines, type matter, and a large, essentially solid, black area. The entire assembly was placed on a horizontal turntable 24 inches in diameter over which were arranged an S–4 type mercury vapor lamp, 16 inches above the table and three RS type mercury vapor lamps, 10 inches above the table and arranged around its periphery with their beams directed downward at an angle of about 45°. With the turntable rotating at 4 R. P. M., an exposure of 25 minutes was given. Because one of the lines in the negative was slightly veiled, this line was given an additional 2 minutes exposure after shielding the remaining area of the negative from the light. On completion of the exposure the negative was removed and the image freed from unpolymerized monomer mixture by washing it with the ethyl acetate/ethanol (87/13) solvent applied with an ordinary 1-inch paint brush. The washed plate was rinsed and dried for a few minutes under the ultraviolet lamps. The image obtained was excellent and the shoulders of the lines, type matter, and so forth were smooth and sloping. By means of a measuring microscope the dimensions of the finished photopolymerized plate were compared with the dimensions of the negative. The measurements indicated that a linear dimension on the plate was only 0.06% smaller than on the negative indicating extremely high dimensional fidelity. Actually, this shrinkage appears to be caused by the difference in coefficient of expansion of the base material and the negative and has nothing to do with the shrinkage of the polymerizing mixture. For example, the thermal coefficient of expansion of magnesium is $26\times10^{-6}/°$ C. and for plate glass $9\times10^{-6}/°$ C. Over the approximately 40° C. temperature interval between the exposure temperature of 65° C. at which the image was formed and room temperature of 25° C. at which measurements were made the calculated net dimensional change is 0.068% as compared to the 0.06% actually observed. The sloping images made an angle of about 67° with the horizontal base.

The plate was trimmed, then locked in position in a vertical printing press. Virtually no makeready was required other than adjustment of the plate to proper printing height. With the usual metal plates or electrotypes, considerable makeready is required to obtain a uniform impression of a form of this character possessing numerous thin lines and a large solid area. Printing was carried out in the usual manner and over 90,000 impressions were made on a bond paper stock. It was noted that during the printing operation it was necessary to clean the plate only about half as often as with regular metal plates. This is attributed to the shoulder characteristics of the image which did not tend to accumulate ink as rapidly as conventional plates. Although some wear was evident in portions of the image near the edge of the plate, it was no more severe than usually noted under the same conditions in nickel-faced electrotypes, which are more expensive and are normally used only where extreme wear is to be expected in long press runs.

*Example X*

A 35-mil layer of the photosensitive composition of Example VIII was placed between glass plates coated with the parting agent or plastic mold-releasing agent of Example VIII and the assembly exposed to mercury vapor lamps above the turntable as described in Example VIII. With the turntable rotating at 4 R. P. M. and an exposure of 3 minutes, a stiff gelled sheet was obtained. This was stripped from the glass and laid down on a steel base plate which had been primed and treated with an anchor layer as described in Example VIII. A stripping film process negative on glass protected by a sheet of regenerated cellulose was pressed on the solid gel and the assembly exposed to the turntable lights for 10 minutes. The negative was removed and the plate immersed in ethyl acetate/ethanol (87/13 by weight) and scrubbed with a fine wire suede brush. The solvent rendered the incompletely polymerized gel in the unexposed area quite friable so that these areas were easily brushed away while the exposed areas were hard and essentially completely polymerized and were unaffected by the solvent and the brushing treatment. A good image was obtained in this manner.

*Example XI*

A steel base plate with an anchor layer of the type described in Example VI was coated with a 10-mil layer of a photopolymerizable composition containing 55 parts of methyl methacrylate, 20 parts of polymeric methyl methacrylate, 25 parts of monomeric polyethyleneglycol dimethacrylate and 1 part of benzoin. The layer was covered with a glass plate treated with a parting agent or plastic mold-releasing agent, e. g., a polysilicone oil, and the assembly exposed under an RS type mercury vapor lamp at a distance of 8 inches for 4 minutes. The glass was then removed leaving the gelled photosensitive layer on the metal base plate. By means of a conventional vacuum printing frame this light-sensitive plate was held in contact with a halftone negative and exposed to the mercury vapor lamp at a distance of 8 inches for 12 minutes. The halftone relief image was then obtained by scrubbing the exposed plate as described in Example X.

*Example XII*

A syrup was prepared by mixing 45 parts of methyl methacrylate, 30 parts of polymeric methyl methacrylate, 25 parts of monomeric polyethyleneglycol dimethacrylate, and 1 part of benzoin. To 80 parts of this syrup was added 20 parts of a specially prepared low density organophilic silica having particles no greater in size than 1 micron and an appreciable proportion less than 0.1 to .01 micron. The resulting mixture was passed through a three-roll ink mill to obtain a sticky mass which was converted to a stiff putty upon addition of 2 more parts of silica. There was some loss of methyl methacrylate during the milling operation and the approximate composition of the putty was as follows: 19 parts of methyl methacrylate, 28 parts of polymeric methyl methacrylate, 25 parts of monomeric polyethyleneglycol dimethacrylate, 1 part of benzoin and 27 parts of silica. With the aid of a hydraulic press, a portion of the mixture was pressed to give a 15–20 mil layer on a steel base plate prepared as described in Example VIII. A sheet of regenerated cellulose was used to protect the top surface of the sensitive material during the pressing operation and was allowed to remain in place after the plate was removed from the press. The plate was exposed through a line negative to an S–4 mercury vapor lamp at a distance of 8 inches. A stepped exposure of 16, 18, 20, 22 and 24 minutes was given to the plate. After removal of the negative, the plate was immersed in an 87/13 by weight ethyl acetate/ ethanol solvent mixture and cleaned by gentle scrubbing with a brush. The image was satisfactory with an exposure of 18–20 minutes.

The same sensitive mixture after storage at 5° C. for two months was calendered out as a 10 mil film which was placed on a primed base plate as above. This plate was exposed directly in contact with a 60-line screen halftone negative to an S–4 mercury vapor lamp at a distance of 8 inches for 20 minutes. The plate was freed from unpolymerized material as described above and after drying was examined under a microscope. The highlight dots were sharp and the shadow areas, even those with as much as 70% black area, had holes which extended completely through to the base.

*Example XIII*

A sheet of aluminum foil 1 mil thick was coated with a black wrinkle enamel, allowed to air dry and then baked for one hour at 135° C. A 40-mil layer of methyl methacrylate/polyethyleneglycol dimethacrylate/benzoin composition containing silica particles similar to that described in Example XII was calendered onto the primed foil. The resulting flexible, photopolymerizable film composition, consisting of the flexible metal foil base, an antihalation layer superposed thereover and adherent thereto, and a solid, flexible, transparent, photopolymerizable layer superposed thereupon and adherent thereto, was exposed 15 minutes underneath a line negative to an RS type mercury vapor lamp at a distance of 8 inches. After exposure the plate was brushed in an ethyl acetate/ethanol (87/13 by weight) solvent mixture to remove unexposed material and give a sharp relief image. A double-coated, pressure-sensitive adhesive tape was used to fasten the foil plate to a heavy backing plate which brought the relief surface to type height.

*Example XIV*

A photosensitive composition was prepared by mixing 20 parts of isobutyl methacrylate, 24 parts of styrene, 56 parts of the unsaturated polyester of Example VIII and 1 part of benzoin methyl ether. A 35-mil layer of this composition was coated on a ¼ inch sheet of polymeric methyl methacrylate and covered with an image on film squeegeed to a glass plate. This image was a positive, i. e., having black letters on a clear background, so that the plate obtained would give a "reverse" print. The assembly was exposed for 8 minutes on the turntable under the light system of Example IX, after which the film was removed and the plate merely blotted with fresh paper tissues until the unpolymerized syrup was removed. An excellent plate was obtained with the main bodies of the letters penetrating to the base plate. Smaller lines did not penetrate completely through the photopolymerized layer but all lines were of adequate depth for proper printing.

*Example XV*

A gray, low pressure paper laminate 92 mils thick in which the laminating resin was a mixture of styrene and isobutylmethacrylate with unsaturated polyesters of the type described in Example VIII was used as a base material for making a printing plate. After lightly sanding the plate surface to provide a slight tooth, it was placed on a large sheet of plate glass and coated with the photosensitive composition of Example VIII. Metal spacers 158 mils high were arranged on the glass plate at the corners of the laminated base plate and a line negative on film approximately 6 mils thick and squeegeed to glass as described in Example VIII was lowered onto the photosensitive syrup so that the glass carrying the negative film rested on the spacers. Thus the distance from the bottom of the laminated base plate to the surface of the negative in contact with the syrup was 152 mils. The assembly was placed on the turntable with the light arranged as in Example IX and given an exposure of 15 minutes over the entire negative and then, with the main portion shielded, given an additional 5 minutes to "burn in" some fine detail. The plate was immersed in a tray of ethyl acetate/ethanol (87/13 by weight) solvent mixture, brushed with a paint brush, rinsed in fresh solvent, and dried. An excellent image was obtained. The thickness of the plate was approximately 152 mils corresponding to the printer's standard 11-point plates. The printing surface of the image was 60 mils above the non-printing background. This relief height is adequate for all classes of letterpress printing without requiring any hand routing.

*Example XVI*

A plastic base plate was prepared by photopolymerizing a 35-mil layer of the sensitive mixture of Example VIII between sheets of plate glass. A surface of the resulting sheet was sanded lightly, coated with a layer of the same photosensitive mixture and a ruled form negative on glass lowered onto the syrup until the negative rested on 35-mil spacers arranged at the edges of the base plate. Six 15-watt BL–360 fluorescent lamps were arranged 5 inches above a horizontal turntable on which the above base-negative assembly was placed. After an exposure of one hour, the negative was removed and the plate washed in an ethyl acetate/ethanol (87/13 by weight) solvent mixture. An excellent image was obtained. Observations with a measuring microscope indicated that negative and finished plate were exactly the same size. This dimensional fidelity is attributed to the fact that the fluorescent lamps are relatively cool, ultra-violet light sources and the polymerization therefore took place essentially at room temperature.

*Example XVII*

A photosensitive composition was prepared by mixing 70 parts of polymeric methylmethacrylate granules, 27 parts of methyl methacrylate, 20 parts of monomeric polyethyleneglycol dimethacrylate, and 1 part of benzoin. Initially this gave a slurry which gradually thickened to a doughy mass as the granules absorbed the fluid portion of the mixture. A portion of the dough was placed between sheets of regenerated cellulose and rolled out to a thickness of 30 mils. The cellulose sheet on one side was removed and the surface of the flexible photosensitive composition pressed onto a sheet of 26-gauge aluminum which had been primed as described in Example I. A negative was placed against the cellulose sheet protecting the top surface of the dough and the plate and negative placed under an RS type mercury vapor lamp at a distance of 7 inches for 12 minutes. The line negative and the cellulose sheet were removed and the plate placed in warm ethyl acetate/ethanol (87/13 by weight) mixture and scrubbed with a brush. A sharp image was visible on the surface initially but as brushing was continued to remove all of the unpolymerized material in the unexposed areas, the sharp edges of the image were rounded slightly so that the finished plate had an unsharp image. In other similar experiments with photosensitive layers 5–10 mils thick the image remained quite sharp, indicating that such mixtures would be more suitable for the thin layers required for halftone plates. In the case of the thicker plates it is believed that the longer solvent treatment required to remove the thick unpolymerized areas results in some swelling and disintegration of the sharp edges of the image.

*Example XVIII*

An addition polymerizable, unsaturated polyester resin, more specifically an unsaturated alkyd resin, was prepared by reacting glycerol, phthalic anhydride, methacrylic acid, and cocoanut oil to give a final product whose composition was as follows: 23 parts of cocoanut oil, 21 parts of glycerol trimethacrylate, 24 parts of glycerol triphthalate and 2 parts of unreacted glycerol. This resin can be characterized as a polymeric glycerol diphthalate with the third hydroxyl group esterified with methacrylic acid or with the cocoanut oil acid. A photopolymerizable composition was prepared by mixing 50 parts of the resin with 50 parts of monomeric polyethyleneglycol dimethacrylate and 1 part of benzoin methyl ether. A steel base plate coated with the primer and anchor layer of Example IX was coated with a 35-mil layer of the photosensitive syrup on which was placed a line process negative, in a stripping film of the type described in Example I of White and Hill, U. S. application Ser. No. 125,198, filed November 5, 1949, now U. S. Patent 2,638,417, mounted on glass. The assembly was given a 25-minute exposure on the turntable rotating at 4 R. P. M. with the lamps described in Example IX. After exposure, the plate was washed in an ethyl acetate/ethanol (87/13 by weight) solvent mixture in order to remove unpolymerized sensitive material. A good image was obtained.

*Example XIX*

An unsaturated alkyd resin, as in Example XVIII, was prepared by reacting cocoanut oil, pentaerythritol, maleic anhydride and triethyleneglycol to give a resin represented by the following composition: 17.15 parts of cocoanut oil, 72.85 parts of triethyleneglycol maleate, 8.05 parts of pentaerythritol dimaleate and 1.95 parts of unreacted triethylene glycol. The viscosity of a 50% solution of the resin in toluene was 4.85 poises. A photosensitive composition was prepared by mixing 30 parts of the above alkyd, 25 parts of the alkyd of Example XVIII, 45 parts of monomeric polyethyleneglycol dimethacrylate, and 1 part of benzoin methyl ether. A plate was coated, exposed and processed as described in Example XVIII. A sharp, tough image was obtained.

The nature of the photopolymerizable layer when the fillers are present, e. g., the polymers of the monomers or inorganic, fine particle size, transparent fillers, varies with the particular type of filler. For instance, when relatively low area fillers (i. e., those containing a relatively low surface area per unit weight), e. g., powdered glass, are admixed with the photopolymerizable monomers, the compositions are generally noncohesive, slurry type semisolids. When the fillers of higher area, such as the organophilic silicas are used, the compositions are fairly cohesive pastes. When the relatively low molecular weight polymers of the monomers are used as fillers, the compositions are likewise pasty semisolids, but more sticky and putty-like in character. When the high molecular weight polymers of the monomers are present, the compositions range in character from stiff putties to rigid gels.

As pointed out previously the photopolymerizable layer may be composed of any addition polymerizable monomer including mixtures of two, three or more monomers and any initiator photosensitive to actinic light either singly or in admixture with other initiators. Because of their availability and lower cost, the terminal monoethylenically unsaturated monomers, i. e., the vinylidene monomers particularly the vinyl monomers are preferred. These monomers include the vinyl carboxylates or precursors thereto, e. g., those wherein the vinyl group is in the acid portion of the molecule, such as acrylic acid and its esters, e. g., methyl acrylate, ethyl acrylate, n-butyl acrylate; acrylonitrile, methylacrylonitrile; the α-alkyl acrylates such as methacrylic acid and ethacrylic acid and their esters such as methyl-n-propyl, n-butyl, isopropyl, and cyclohexyl meth- and ethacrylates and the like; alpha-substituted acrylic acids and esters thereof, such as ethyl α-chloroacrylate, ethyl α-cyanoacrylate, and the like; those vinyl components wherein the vinyl group is in the non-acid portion of the molecule, such as the vinyl esters, e. g., vinyl acetate, vinyl chloroacetate, vinyl trimethylacetate, vinyl propionate, vinyl benzoate, and the like; vinyl hydrocarbons, e. g., the vinyl aryls, such as styrene and the like; the vinylidene halides, such as vinylidene chloride. The just described monomers and mixtures of two or more monomers are liquids which boil above room temperature and should be chosen to give coherent, mechanically-strong polymeric films by bulk polymerization techniques. Of these monomers, because of their relatively high rates of photo-initiated polymerization, the vinyl aryls and/or esters or acrylic and alpha-substituted acrylic acids with solely hydrocarbon monoalcohols of no more than 6 carbons and particularly the lower alkanols of 1 to 4 carbon atoms, are preferred. Styrene and the alkyl hydrocarbon substituted acrylic acids wherein the alkyl groups contain 1 to 4 carbon atoms are particularly preferred.

Practically any initiator or catalyst of addition polymerization which is capable of initiating polymerization under the influence of actinic light can be used in the photopolymerizable layer of this invention. Because transparencies transmit both heat and light and the conventional light sources give off heat and light, the preferred catalysts or initiators of addition polymerization are not activatable thermally and preferably are soluble in the polymerizable monomer to the extent necessary for initiating the desired polymerization under the influence of the amount of light energy absorbed in the relatively short term exposures used in the process of this invention. Precautions can be taken to exclude heat rays so as to maintain the photopolymerizable layer at temperatures which are not effective in activating the initiator thermally but they are troublesome. In addition, exclusion of heat rays makes necessary longer exposure times since the rate of chain propagation in the polymerization reaction is lower at reduced temperatures. For this reason the photo-initiators most useful for this process are those which are not active thermally at temperatures below 80–85° C. These photopolymerization initiators are used in amounts of from 0.05 to 5% and preferably from 0.1 to 2.0% based on the weight of the total photopolymerizable composition.

Suitable photopolymerization initiators or catalysts include vicinal ketaldonyl compounds such as diacetyl, benzil, etc.; α-ketaldonyl alcohols such as benzoin, pivaloin, etc.; acyloin ethers such as benzoin methyl or ethyl ethers; alpha-hydrocarbon substituted aromatic acyloins including α-methylbenzoin, α-allylbenzoin, and α-phenylbenzoin.

Most commercially available polymerizable monomers and polymers discussed previously for use in the photopolymerizable compositions normally contain minor amounts (about 50–100 parts per million by weight) of polymerization inhibitors so as to prevent spontaneous polymerization before desired. The presence of these inhibitors, which are usually of the anti-oxidant type, e. g., hydroquinone, tertiary butyl catechols and the like in such amounts causes substantially no undesirable results in the photopolymerizable layers of this invention either as to speed or quality of polymerization. In fact, larger quantities of such inhibitors, e. g., of the order of 200–500 parts per million can easily be tolerated and may be advantageous in tending to reduce unwanted polymerization in nonexposed, i. e., non-image, areas.

The selection of the correct exposure is an important feature in the photopolymerization process of this invention. Thus, in making printing plates it is essential that the exposure be sufficient to harden or insolubilize the photopolymerizable mixture in the irradiated or image areas without causing significant polymerization in the non-image areas. In addition to the obvious variables of exposure time and light intensity, the extent of the exposure is dependent on the monomer or monomer mixture used, the initiator, the thickness of the sensitive layer, the polymerization temperature, the character of the negative image to be reproduced, and the presence of light-absorbing pigments or dyes in the photopolymerizable mixture. Thus acrylate and methacrylate/dimethacrylate compositions require less exposure time than styrene/unsaturated alkyl types while the benzoin ethers are more efficient photoinitiators than benzoin and consequently require less exposure. In general, the thicker the layer to be polymerized, the longer is the exposure required. It has been observed that polymerization starts at the surface of the photopolymerizable layer closest to the light source, and proceeds downward to the base. With insufficient exposure, the image may have a hard surface showing fine detail but this will not be attached to the base or support and is removed upon removing the unexposed areas. Inasmuch as the polymerization chain propagation rate usually increases at higher temperatures, less exposure is required at elevated temperatures than at room temperatures. For this reason ultra-violet light sources that furnish some heat appear to be much more efficient than cold ultra-violet sources.

In general, the finer the detail in the process transparency the greater the exposure required. This is particularly true where oblique light is used.

While some of the photopolymerizable strata referred to above may lead to haze upon exposure that is not a serious disadvantage particularly when coarse detail is involved. In the case of fine detail haze-producing strata, in general, should be avoided.

The inclusion of dyes or pigments in the photopolymerizable mixture serves no useful purpose in the preparation of printing plates. Instead, the exposures required are increased. This is particularly true with opaque pigments which tend to prevent penetration of light to the lower portions of the sensitive material, thereby giving a surface image only.

In view of factors which influence the exposure, it has been found that the exposure time is best determined by trial and error much as any photographic material must be handled. A convenient procedure for this type of exposure determination is the stepped exposure as described in Example VII.

Although photopolymerized images in the layers and elements of this invention can be prepared by projection, the exposure times are long. For greatest fidelity and rendition of fine detail, contact exposures are best made with the emulsion of the transparency in contact with or spaced no more than a few mils from the photopolymerizable layer. This is especially true when divergent light beams are used. It should be noted that a light beam of this character is practically a necessity when fine detail is to be shown at image heights of 30–60 mils. Line reliefs 30 mils high and only 5 mils wide with parallel sides such as would be obtained by the use of a parallel light beam have the disadvantage that they are easily broken or deformed by slight lateral pressure. Line reliefs of trapezoidal-shaped cross-section obtained with oblique light rays are much stronger.

When oblique rays are used, even a thin regenerated cellulose sheet as a parting layer between the surface of the transparency and the photopolymerizable layer causes some broadening of the image. Ordinarily, this is not significant except in the preparation of halftone plates or line plates with fine lines. Such plates are best prepared with the negative directly in contact with the sensitive material except for an extremely thin layer of a parting agent such as silicone oil, or one of the proprietary mold release agents such as "Vejin" (soybean lecithin) sold by Vejin, Inc., 944 West 5th, Cincinnati, Ohio, and "Polyplastex" sold by Polyplastex United, Inc., Bronx, New York.

The particular photopolymerization material selected preferably should not exhibit shrinkage of greater than 15% because images with slightly cupped surfaces are obtained above that percentage. A discussion of polymerization shrinkage and methods for predicting the amount of shrinkage in various compositions is given by Nichols and Flowers, Ind. Eng. Chem., 42, 292 (1950).

As pointed out previously, a convenient method for carrying out the process of this invention involves the photopolymerization through an image-bearing transparency directly in contact with the photopolymerizable composition being used. In this method it is desirable that the photopolymerizable composition be appreciably more viscous than the monomer itself. It is, of course, possible to prepare photopolymerizable compositions in the desired ranges of viscosity by partially polymerizing the polymerizable monoethylenically unsaturated monomer being used prior to the exposure through the image-bearing transparency. Such partial pre-polymerization can be effected by purely thermal means or through the use of thermally actuated polymerization initiators, or, indeed, by exposing the photosensitive monoethylenically unsaturated composition to light for short periods of time.

It is preferable to raise the viscosity of the photopolymerizable monomer composition to the desired range by the incorporation of a preformed condensation or addition polymer which should yield transparent mixtures with such composition. The preformed addition polymers are largely soluble to an appreciable extent in the corresponding unpolymerized monomer or a monomer of the same general type. Accordingly, a practical means of obtaining the photopolymerizable compositions of high viscosity or gel character is to add thereto the necessary amount of preformed polymer corresponding to the polymerizable monomer being used. Amounts from 5 to 25% by weight on the basis of the final composition are suitable for the viscous liquid type and up to 80% can be used in the case of gel or solid layers. The same general solvation characteristics of polymers versus monomers also generally hold true for preformed addition polymers not necessarily of the same monomer being used but of the same general type. Representative examples of the preformed polymers which can be incorporated into a photopolymerizable composition include the following: polymers and copolymers of methacrylic and acrylic acid esters, such as methyl methacrylate, ethyl acrylate, etc.; polyvinyl acetate; polystyrene; and copolymers of vinyl chloride and vinyl acetate, etc.

The efficiency of this process depends upon the difference in solubility between the polymerized areas in the photopolymerized layer and the portions of said layer which remain unpolymerized. These polymerized areas are, of course, those upon which the actinic lights has fallen after passage through the image-bearing transparency. In order to make the process more efficient, it is desirable that the photopolymerized areas be made as insoluble as possible in the shortest amount of time, i. e., using the shortest exposure. The relative solubility of a polymer depends not only on its extent of polymerization, but also upon its degree of cross-linking. The introduction of cross-links into a polymer increases its insolubility in selected solvents at a much more rapid rate than merely increasing the extent of linear polymerization. In addition, cross-linking causes the early development of a gel structure in the polymerizing body with a resulting net increase in polymerization rate, presumably by reducing the rate of the chain termination reaction. For these reasons it is desirable that from 5 to 100% of the polymerizable monomers in the photosensitive composition be cross-linking materials. A useful class of such materials are the polymerizable monomers containing two ethylenic unsaturations, preferably terminal, conjugated or not, e. g., methacrylic and acrylic acid diesters of ethylene glycol and the polyethylene glycols, such as diethyleneglycol, triethylene glycol, tetraethylene glycol, etc., or mixtures of these ether alcohols; methacrylic and acrylic diesters of polymethylene glycols such as trimethylene glycol, hexamethylene glycol, etc.; divinylacetylene, divinylbenzene, diisopropenyldiphenyl, crotyl methacrylate, diallyl phthalate, diallyl maleate, triallyl cyanurate; etc.

While the crosslinking agents discussed above are illustrated specifically only with monomeric materials, it is to be understood that polymers containing a plurality of unsaturated further addition polymerizable linkages can also be used. A useful class of such materials are the unsaturated addition polymerizable polyesters including the alkyds wherein the unsaturation can be present in the acid component, e. g., an alkyd having an unsaturated monobasic or dibasic acid component or the linear polyesters of unsaturated diols or dibasic carboxylic acids, for instance, the glycol esters of such acids, e. g., polyethylene glycol maleate or polyethylene glycol fumarate; or the ether/glycol esters of such acids, e. g., polydi-, tri-, tetra-, etc., ethylene glycol esters of maleic and fumaric acids. These polyester crosslinking agents serve not only to crosslink the photopolymerizable compositions but also to increase the viscosity of the starting photopolymerizable compositions to the desired range including the higher ranges needed for the gel or solid layers used in the in toto preparation of the multilayer photopolymerizable plate, as has already been illustrated.

Because of their relatively rapid rate of polymerization activated by a photosensitive initiator, the acrylic and alpha-substituted (preferably hydro-carbon substituted) acrylic acid esters of the polymethylene glycols and ether alcohols where the alkyl group contains 1 to 4 carbon atoms are preferred. Mixtures of such glycol esters can be used, suitable mixtures being described in Marks U. S. Patent 2,468,094, granted April 26, 1949. This speed of photopolymerization is of importance in the process. Compositions capable of fast polymerization, e. g., of the order of 1 to 5 or 10 minutes or less, are obviously more desirable than those necessitating longer polymerization cycles, e. g., 4–24 hours or more, since processing times and therefore major costs are thereby materially reduced.

The solvent liquid used for washing or "developing" the plates made from fluid photopolymerizable compositions is primarily only a diluent which reduces the viscosity of the unpolymerized mixture so that it is easily removed by brushing, blotting and so forth. The liquid must be selected with care since it is desirable that it be easily miscible with the sensitive mixture, yet have little action on the hardened image or upon the base material, non-halation layer, or anchor layer in the time required to remove the unpolymerized mixture. Mixtures of methanol and/or ethanol, with methyl or ethyl or propyl acetate and especially ethyl acetate/ethanol mixtures have been found to be well suited for a large variety of photopolymerizable compositions. An 87/13 by weight blend of ethyl acetate/ethanol has a boiling range which is satisfactory since it is high enough to avoid blushing but at the same time is low enough that excess solvent evaporates readily. Other solvents such as propyl acetate, toluene, ethylene glycol monoethyl ether and mixtures, are suitable but are not as convenient to use because of their lower evaporation rate. Ketones as well as certain of the chlorinated hydrocarbons and mixtures are not generally useful because they tend to attack the polymerized material more rapidly than the preferred solvents.

It is to be noted that in the foregoing discussions regarding methods of developing the photopolymerized images "solvent" is used in its broadest sense as including not only organic solvent systems but water and other aqueous systems in those instances where the photopolymerizable layer is soluble (including dispersible) in said systems and the layer after substantially complete photopolymerization is not so affected. Depending on the nature of the photopolymerizable layer, it is in fact advantageous to use such aqueous systems where possible since they obviously eliminate the hazards normally encountered with organic solvents. In particular, it is to be noted that in those instances where the photopolymerizable layer is acidic or basic it is especially convenient to develop the printing relief by dissolving or dispersing the non-exposed areas in an aqueous system of the opposite polarity, i. e., to use an aqueous acidic solvent system with a basic photopolymerizable layer and a basic system with an acidic layer. As a specific example of such systems, there may be mentioned aqueous alkaline developers such as dilute aqueous sodium carbonate or sodium hydroxide solutions with the photopolymerizable layers containing the acidic unsaturated addition polymerizable polyesters. Obviously the degree of acidity or alkalinity should not be allowed to reach those levels wherein the polymer in the essentially completely photopolymerized areas is attacked.

The same types of solvents are also suitable for "developing" solid or gelled polymerizable layers. With element containing such layers the principal function of the solvent is to render the gelled portions friable so that brushing or scrubbing will dislodge the incompletely polymerized solid areas leaving the hardened polymer in relief. In large scale work both types of plates are advantageously "developed" by application of the solvent by means of jets or sprays.

The light absorptive layer intermediate between the light-reflective support and the photopolymerizable composition, as has been pointed out previously, is important to this specific aspect of the invention. It permits the direct preparation by photopolymerization of sharply detailed reliefs of sufficient thickness and adequate strength for printing which are adequately bonded to the reinforcing light-reflective support. Any agent absorptive of actinic light may be used as the active agent in this intermediate layer. Suitable materials of this type are dyes and pigments, with the latter being preferred since no migration or bleeding into the photopolymerizable layer is possible.

Useful inorganic pigments include iron oxide in its various forms such as Indian red, Venetian red, ocher, umber, sienna, iron black, etc.; lead chromate, lead molybdate (chrome yellow and molybdenum orange); cadmium yellow, cadmium red, chrome green, iron blue, manganese black, various carbon blacks, such as lamp black, furnace black, channel black, etc. Organic dyes soluble in the vehicles normally used to apply the light absorptive layer, often bleed into the photopolymerizable monomer layer. However, by means of a double-coating technique, certain dyes such as red oil dyes of Colour Index No. 258, certain spirit-soluble dyes such as violet dyes of Colour Index Nos. 680 and 681, green dyes of Colour Index No. 657, yellow dyes of Colour Index Nos. 655 and 800, brown dyes of Colour Index No. 332, etc., can be used satisfactorily. Organic dyes are best employed as pigments in the form of lakes prepared by precipitating an insoluble salt of the dye on an inert inorganic substratum. An extensive list of such lakes and similar organic pigments is included in pages 124–173 of "Printing and Litho Inks" (4th edition) by H. J. Wolfe, MacNair-Dorland and Company, New York (1949).

This light-absorptive layer intermediate between the photopolymerizable layer and the reinforcing light-reflective support as taught above must have adequate adhesion to the reinforcing base plate and the photopolymerized layer and not react with the light-absorptive material. The essential component or binding agent of the intermediate layer is essentially polymeric in nature. Additional suitable polymeric or resin carriers for the light-absorptive dyes or pigments which can be substituted for those in the examples include: vinyl halides, e. g., polyvinyl chloride; vinyl copolymers particularly of vinyl halides, e. g., vinyl chloride with vinyl acetate, diethyl fumarate, ethyl acrylate, allyl glycidyl ether, glycidyl methacrylate; vinyl chloride/vinyl acetate/maleic anhydride copolymer; polyvinyl butyral; monomeric dimethylacrylate esters of the polyethylene glycols in combination with vinyl chloride copolymers; and styrene or diallyl phthalate with polyesters such as diethylene glycol maleate, diethylene glycol maleate/phthalate, triethylene glycol fumarate/sebacate, etc.

An advantage of the invention is that halftone and line printing plates can be made in a short period. It will vary with the particular photopolymerizable composition, catalyst and intensity of the light. Thus, the exposure period may vary from 15 seconds to 20 minutes although longer polymerization cycles of several hours can be used.

This invention provides a simple, effective process for producing letterpress printing plates from inexpensive materials and with a marked reduction in labor requirements over the conventional photoengraving procedure. The images obtained are sharp and show fidelity to the original transparency both in small details and in overall dimensions. In addition, the process allows the preparation of many types of ruled line plates which could ordinarily be handled only by the tedious wax engraving technique. Moreover, these photopolymerized plates allow much more efficient use of valuable press time since the flatness of the printing surfaces reduces the amount of make ready required on the press. The smooth, clean shoulders of the image printing relief minimize ink buildup during use and save much of the time spent in cleaning operations during a press run. Another important advantage arises from the fact that the resilience and abrasion resistant characteristics of the photopolymerized printing plates make the plate more durable in use than ordinary metal photoengravings. In fact, under optimum conditions the photopolymerized printing plates show wear resistance equivalent to that of the expensive nickel-faced electrotypes. An important commercial advantage is their lightness in weight.

The photopolymerized printing plates can serve as originals for the preparation of stereotypes or electrotypes although in the latter case if only duplicates are desired it is much more convenient and economical to make duplicate photopolymerized plates. Cylindrically curved plates for use on rotary presses can be prepared easily by bending the flat plates which have been heated sufficiently (generally from 100° to 120° C.) to soften the image layer. It is also possible to prepare curved plates directly by polymerization against a curved negative surface. When flexible supports are used and the resulting photopolymerized relief area is flexible the printing element can be formed into the desired curved shape without the application of heat.

A desirable feature of the photopolymerized plates is the ease with which they can be repaired in case of minor accidental damage. In carrying out such repairs the plate is cleaned and roughened slightly in the damaged area, a few drops of photopolymerizable mixture is applied and covered with a piece of glass which is allowed to rest on the printing surface. The plate is then exposed to light to harden the mixture. The solid area obtained in this manner is then worked with engraver's tools to furnish the desired printing area. A plate need not be removed from its base to carry out such operations. Insertions or corrections on large and complicated plates may be handled in essentially the same manner by using a negative of the desired addition instead of the plain glass. In this case the plate must be washed with solvent to remove the unpolymerized portion of the inserted area. Fractures may be repaired and weak spots strengthened by applying a solution of the sensitive composition in acetone or methylene chloride, allowing the solvent to evaporate, and then exposing the plate to light to harden the mixture.

The printing elements of this invention can be used in all classes of printing including planographic, but are most applicable to those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas and those wherein the ink is carried by the recessed portions of the relief such as in intaglio printing, e. g., line and inverted halftone. The plates are obviously useful for multicolor printing.

This application is a continuation-in-part of my copending application Serial No. 242,790, filed August 20, 1951, now abandoned.

As many widely different embodiments of this invention can be made without departing from the spirit and scope thereof, it is to be understood that the invention is not to be limited except as defined by the claims.

What is claimed is:

1. The process of making a printing relief which comprises photopolymerizing with actinic light through an image-bearing transparency, consisting solely of substantially opaque and substantially transparent areas, a photopolymerizable layer comprising (1) an addition polymerizable ethylenically unsaturated component capable of forming a high polymer by photoinitiated polymerization in the presence of an addition polymerization initiator therefor activatable by said actinic light and (2) a small amount of such an initiator, said layer (*a*) being from 3 to 250 mils in thickness, (*b*) being superposed on an adherent support, and (*c*) exhibiting an optical density to said actinic light less than 5.0 and less than 0.5 per mil, until substantially complete addition polymerization of said component to a high polymer occurs throughout the entire thickness of said layer in the areas thereof corresponding to the said substantially transparent areas, whereby the said layer in said corresponding areas is converted to the insoluble state but without any substantial polymerization in the areas of the said layer corresponding to the said substantially opaque areas, and removing the layer in the latter said corresponding areas.

2. A process as set forth in claim 1 wherein said component is a polymer containing a plurality of unsaturated addition polymerizable linkages.

3. The process of making a printing relief which comprises photopolymerizing with actinic light through an image-bearing transparency, consisting solely of substantially opaque and substantially transparent areas, a photopolymerizable layer comprising (1) an addition polymerizable ethylenically unsaturated component capable of forming a high polymer by photoinitiated polymerization in the presence of an addition polymerization initiator therefor activatable by said actinic light and (2) a small amount of such an initiator, said layer (*a*) being from 3 to 250 mils in thickness, (*b*) being superposed on an adherent support having an essentially continuous surface, and (*c*) exhibiting an optical density to said actinic light less than 5.0 and less than 0.5 per mil, until substantially complete addition polymerization of said component to a high polymer occurs throughout the entire thickness of said layer in the areas thereof corresponding to the said substantially transparent areas, whereby the said layer in said corresponding areas is converted to the insoluble state but without any substantial polymerization in the areas of the said layer corresponding to the said substantially opaque areas, and removing the layer in the latter said corresponding areas.

4. A process as set forth in claim 3 wherein the polymerizable component contains at least one terminal $$CH_2{=}C<$$

group.

5. A process as set forth in claim 3 wherein the removing is accomplished by washing.

6. A process as set forth in claim 3 wherein said layer contains acid groups and the washing is accomplished with an aqueous alkaline solution.

7. A process as set forth in claim 3 wherein said support is a sheet of a synthetic polymer.

8. A process as set forth in claim 3 wherein said support is a laminated paper having its surface impregnated with a polymeric anchor material.

9. A process as set forth in claim 3 wherein said transparency is a halftone negative and said layer is 3 to 30 mils in thickness.

10. A process as set forth in claim 3 wherein said transparency embodies a line negative and said layer is 10 to 60 mils in thickness.

11. A process as set forth in claim 3 wherein said photopolymerizable layer is 10 to 60 mils in thickness and the actinic light has oblique rays the most inclined of which form an interior angle with the surface of the base of 63.4° to 76°.

12. A process as set forth in claim 3 wherein said initiator is benzoin methyl ether.

13. A process as set forth in claim 3 wherein said layer is liquid.

14. A process as set forth in claim 3 wherein said layer is solid.

15. A process as set forth in claim 3 wherein said initiator is not active thermally at temperatures below 85° C.

16. A process as set forth in claim 3 wherein said initiator is benzoin.

17. A process as set forth in claim 3 wherein said layer contains a substantial amount of a cross-linking ethylenically unsaturated addition polymerizable material containing a plurality of ethylenic groups.

18. A process as set forth in claim 17 wherein said crosslinking agent is a polyethylene glycol diester of an acrylic acid.

19. A process as set forth in claim 17 wherein said crosslinking agent is a polyethylene glycol dimethacrylate.

20. The process of making a printing relief which comprises photopolymerizing with actinic light through an image-bearing transparency consisting solely of substantially opaque and substantially transparent areas, a photopolymerizable layer comprising (1) an addition polymerizable ethylenically unsaturated component capable of forming a high polymer by photoinitiated polymerization in the presence of an addition polymerization initiator therefor activatable by said actinic light and (2) a small amount of such an initiator, said layer (*a*) being from 3 to 250 mils in thickness, (*b*) being superposed on a stratum absorptive of actinic light on an adherent light-reflecting support having an essentially continuous surface and (*c*) exhibiting an optical density to said actinic light less than 5.0 and less than 0.5 per mil, until substantially complete addition polymerization of said component occurs throughout the entire thickness of the layer in the areas thereof corresponding to the said substantially transparent areas, whereby the said layer in said corresponding areas is converted to the insoluble state, but without any substantial polymerization in the areas of said layer corresponding to the said substantially opaque areas, and removing the layer in the latter said corresponding areas.

21. A process as set forth in claim 20 wherein said support is composed of a metal.

22. The process of making a printing relief which comprises photopolymerizing with actinic light through an image-bearing transparency consisting solely of substantially opaque and substantially transparent areas, a solid photopolymerizable layer consisting of (1) a liquid ethylenically unsaturated compound capable of forming a high polymer by photoinitiated polymerization in the presence of an addition polymerization initiator therefor activatable by said actinic light and (2) a small amount of such an initiator, said liquid containing a sufficient amount of a compatible polymer to render said layer nonflowable, said layer (*a*) being from 3 to 250 mils in thickness, (*b*) being superposed on an adherent support having an essentially continuous surface, and (*c*) exhibiting an optical density to said actinic light less than 5.0 and less than 0.5 per mil, until substantially complete addition polymerization of said ethylenically unsaturated compound occurs throughout the entire thickness of the layer in the areas thereof corresponding to the said substantially transparent areas, whereby the said layer in said corresponding areas is converted to the insoluble state, but without any substantial polymerization in the areas in said layer corresponding to the said substantially opaque areas, and removing the layer in the latter said corresponding areas.

23. The process of making a printing relief which comprises photopolymerizing with actinic light through an image-bearing transparency consisting solely of substantially opaque and substantially transparent areas, a solid photopolymerizable layer consisting of (1) a liquid ethylenically unsaturated compound capable of forming a high polymer by photoinitiated polymerization in the presence of a photopolymerization initiator therefor activatable by said actinic light and (2) a small amount of such an initiator, said liquid containing a finely divided, essentially transparent, inert, immiscible filler having a particle size no greater than 0.2 to 0.4 mil in its greatest dimension in sufficient amount to render said layer nonflowable, said layer (*a*) being from 3 to 250 mils in thickness, (*b*) being superposed on an adherent support having an essentially continuous surface, and (*c*) exhibiting an optical density to said actinic light less than 5.0 and less than 0.5 per mil, until substantially complete addition polymerization of said compound occurs throughout the entire thickness of the layer in the areas thereof corresponding to the said substantially transparent areas, whereby the said layer in said corresponding areas is converted to the insoluble state, but without any substantial polymerization in the areas in said layer corresponding to the said substantially opaque areas, and removing the layer in the latter said corresponding areas.

References Cited in the file of this patent

UNITED STATES PATENTS

| | | |
|---|---|---|
| 1,134,381 | Hatt | Apr. 6, 1915 |
| 1,574,357 | Beebe et al. | Feb. 23, 1926 |
| 1,655,127 | Beebe | Jan. 3, 1928 |
| 1,957,900 | Murray | May 8, 1934 |
| 1,965,710 | Murray | July 10, 1934 |
| 1,981,102 | Hagedorn et al. | Nov. 20, 1934 |
| 2,078,535 | Hagedorn et al. | Apr. 27, 1937 |
| 2,080,965 | Funck | May 18, 1937 |
| 2,100,358 | Royse et al. | Nov. 30, 1937 |
| 2,108,822 | Lippincott | Feb. 22, 1938 |
| 2,115,198 | Eggert et al. | Apr. 26, 1938 |
| 2,215,128 | Muelendyke | Sept. 17, 1940 |
| 2,367,420 | Mullen | Jan. 16, 1945 |
| 2,367,670 | Christ | Jan. 23, 1945 |
| 2,405,513 | Mullen | Aug. 6, 1946 |
| 2,417,238 | Christ | Mar. 11, 1947 |
| 2,475,980 | Murray | July 12, 1949 |
| 2,480,749 | Marks | Aug. 30, 1949 |
| 2,480,751 | Marks | Aug. 30, 1949 |
| 2,480,752 | Rogers | Aug. 30, 1949 |
| 2,544,905 | Van Deusen | Mar. 13, 1951 |
| 2,610,120 | Minsk et al. | Sept. 9, 1952 |
| 2,639,995 | Perry et al. | May 26, 1953 |
| 2,670,287 | Minsk et al. | Feb. 23, 1954 |
| 2,673,151 | Gerhart | Mar. 23, 1954 |
| 2,704,254 | Gresham | Mar. 15, 1955 |

FOREIGN PATENTS

| | | |
|---|---|---|
| 310,820 | Great Britain | Apr. 29, 1929 |
| 566,795 | Great Britain | Jan. 15, 1945 |

OTHER REFERENCES

Flader et al.: Modern Photoengraving, 1948, Modern Photoengraving Publishers, Chicago, Cincinnati, pages 180 to 182 and 205.